(12) United States Patent
Chang et al.

(10) Patent No.: US 6,358,864 B1
(45) Date of Patent: Mar. 19, 2002

(54) METHOD OF FABRICATING AN OXIDE/ NITRIDE MULTILAYER STRUCTURE FOR IC MANUFACTURE

(75) Inventors: Yi-Shin Chang, Taipei; Ming-Kuan Kao, Hsinchu; Yi-Fu Chang, TaiNan; Chien-Hung Chen, Taipei, all of (TW)

(73) Assignee: Mosel Vitelic Inc., Hsinchu (TW)

( * ) Notice: Subject to any disclaimer, the term of this patent is extended or adjusted under 35 U.S.C. 154(b) by 0 days.

(21) Appl. No.: 09/305,292

(22) Filed: May 5, 1999

(30) Foreign Application Priority Data

May 3, 1999 (TW) .......................... 088103353

(51) Int. Cl.[7] .................. H01L 21/336; H01L 21/31; H01L 21/469
(52) U.S. Cl. .............. 438/763; 438/261; 438/287; 438/787; 438/791

(58) Field of Search .................... 438/261, 287, 438/763, 787, 791, 909, 954

(56) References Cited

U.S. PATENT DOCUMENTS 4,810,673 A * 3/1989 Freeman ..................... 437/239
5,981,404 A * 11/1999 Sheng et al. ................ 438/791

* cited by examiner

Primary Examiner—John F. Niebling
Assistant Examiner—Alexander G. Ghyka
(74) Attorney, Agent, or Firm—Bacon & Thomas

(57) ABSTRACT

A method of fabricating an oxide/nitride multilayer structure is disclosed. The multilayer structure of dielectric films could be applied for manufacturing $E^2PROM$, flash memories, or the dielectric layers of a DRAM capacitor. In accordance with the present invention, all films are formed in the same chamber, and only one heating and one cooling step are needed to form an oxide/nitride/oxide structure or an oxide/nitride/oxide/nitride structure.

13 Claims, 3 Drawing Sheets

METHOD OF FABRICATING AN OXIDE/NITRIDE MULTILAYER STRUCTURE FOR IC MANUFACTURE

BACKGROUND OF THE INVENTION

1. Field of the Invention

The present invention relates to a method of fabricating a multilayer structure of dielectric films, such as oxide/nitride/oxide or oxide/nitride/oxide/nitride.

2. Description of the Related Art

In recent years, the sizes of the MOSFETs and capacitors have become continuously smaller so that the packing densities of these ICs have increased considerably. Along with the large shrinkage of ICs' critical dimention, the thickness of dielectric films is also largely reduced. The commen used dielectric film is oxide. Along with the reduce of oxide thickness, the resistivity strength is not large enough for device operation. As a result, some multilayer structures of dielectric films were disclosed to enhance the resistivity strength, such as oxide/nitride/oxide or oxide/nitride/oxide/nitride. The multilayer structure of dielectric films could be applied for manufacturing the dielectric layer between the floating gate and control gate of $E^2PROM$ and flash memories. It could also be applied for the dielectric layer between the top electrode and bottom electrode of a capacitor.

In accordance with the prior art, the multilayer structures such as ONO or ONON were formed by the method of low-pressure chemical vapor deposition (LPCVD) at different chambers for each film. Referring now to FIG. 1, a process flow for ONO structure manufacture is shown. For each oxide or nitride deposition, it is necessary to perform the following steps: (1) temperature elevation, (2) film deposition, and (3) annealing and then cooling. In addition, it is necessary to load and unload the substrate to/from different chambers for each film. According to FIG. 1, the steps for film deposition are only Step 2, 5, and 8, and it takes only 0.5 to 1 hour. However, the whole procedure spends 3 to 4 hours for ONO manufacture, because it is very time wasting to heat and cool the chambers such as Step 1, 3, 4, 6, 7, and 9. Therefore, if a process flow could eliminate some steps for heating and cooling, the throughput could thus be largely enhanced. In addition, it is not necessary to load and unload the substrate for each layer, during the processes of forming the multilayer structure of dielectric films. Therefore, metal and organic contamination would not occur during the process. Moreover, the wafer crack due to heating and cooling process would not also occur.

As mentioned above, the present invention provides a new method for manufacturing a multilayer structure of dielectric films. The film performance is as well as that in the prior art. Moreover, the time wasting issue in the prior art is overcome.

SUMMARY OF THE INVENTION

According, it is a primary object of the present invention to provide a method of fabricating a multilayer structure of dielectric films with the advantages of high throughput.

It is another object of the present invention to provide a method of fabricating a multilayer structure of dielectric films with the advantages of low cost.

It is also another object of the present invention to provide a method of fabricating a multilayer structure of dielectric films with the advantages of low contamination.

These objects are accomplished by the fabrication process described below. Firstly, a substrate with a source/drain structure is provided. A thermal oxidation is then performed to form a tunneling oxide. Thereafter, a film of polysilicon or amorphous silicon is formed, and then a floating gate is defined by using a series of processes of photolithography and etching. After that, a multilayer structure of dielectric films could be formed during only one heating and cooling step. The process flow shows as follows: 1. loading the substrate into a chamber and then heating the substrate; 2. an oxide layer, a nitride layer, and an oxide layer are formed in sequence by using LPCVD; the reactants of the LPCVD process for oxide are $N_2O$ and $SiH_2Cl_2$; the reactants of the LPCVD process for nitride are $NH_3$ and $SiH_2Cl_2$; 3. cooling the chamber and then unloading the substrate. Between each deposition process, $N_2$ gas is used for purging the chamber. The multilayer structure of dielectric films could be defined by using the conventional method of photolithography and etching. Finally, a control gate is formed on the multilayer structure of dielectric films, and the gate structure of a flash memory is then finished.

BRIEF DESCRIPTION OF THE DRAWINGS

The accompanying drawings forming a material part of this description, in which.

DESCRIPTION OF THE PREFERRED EMBODIMENTS

Figure 1:
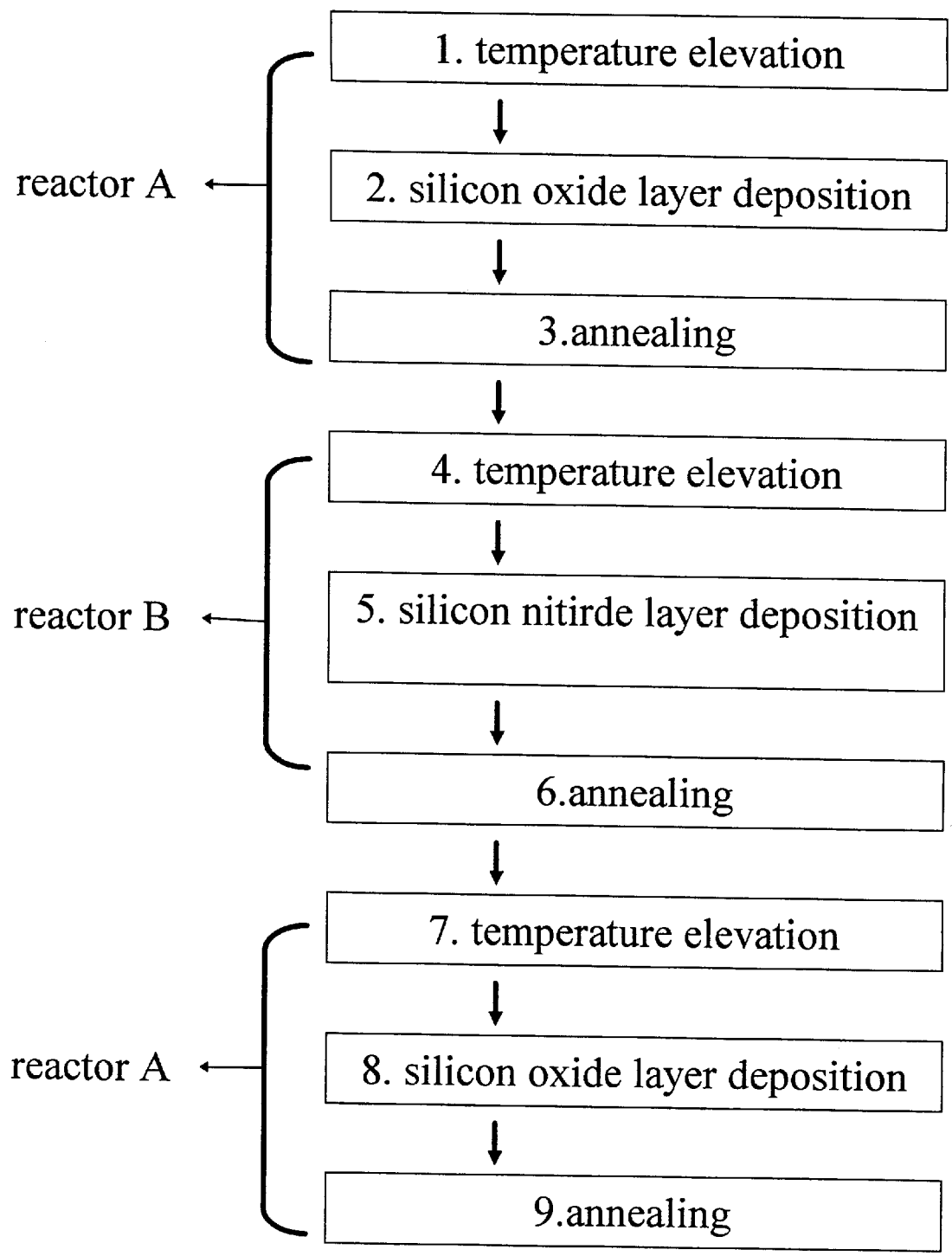
FIG. 1 is a process flow chart for multilayers of dielectric (oxide/nitride/oxide) according to the prior art.

The invention disclosed herein is directed to a method of fabricating a multilayer structure of dielectric films for a split flash memory. The drawing figures are illustrated a partially completed integrated circuit device. In the following description, numerous details are set forth in order to provide a thorough understanding of the present invention. One skilled in the art will appreciate that variations of these specific details are possible while still achieving the results of the present invention. Therefore, the present invention could also be applied for manufacturing $E^2PROM$ and flash memories. In other instance, well-known processing steps are not described in detail in order not unnecessarily to obscure the present invention.

Figure 3:
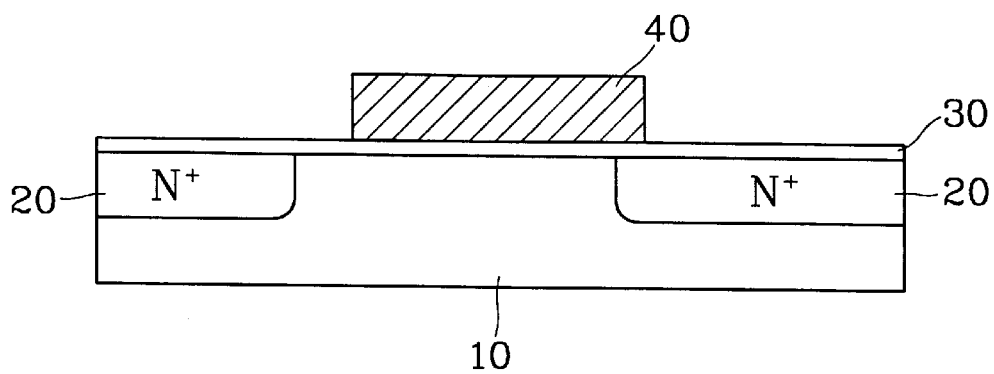
FIG. 3A to 3C are cross sectional representations of the gate structure of a split flash memory according to the present invention.
Figure 3:
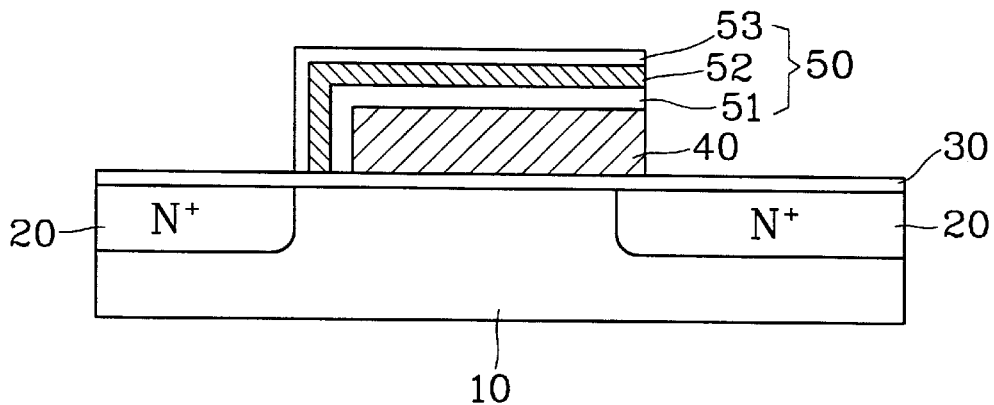
Figure 3:
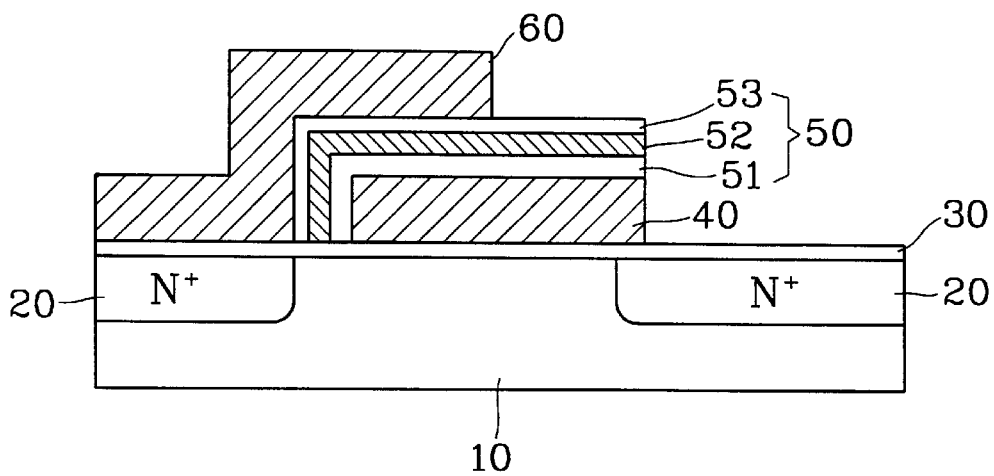

FIG. 3A to 3C are cross sectional representations of the gate structure of the split flash memory according to the present invention. Firstly, referring now to FIG. 3A, a substrate 10 with a source/drain structure 20 is provided. An oxide layer and the first conducting layer are then formed on the substrate 10 to form a tunneling oxide 30 and a floating gate 40. The oxide layer, with a thickness of between 10 to 500 Å, could be formed by using the conventional method of thermal oxidation. The first conducting layer, with a thickness of between 500 to 2000 Å, is made from polysilicon or amorphous silicon. The first conducting layer is formed by using the conventional method of low-pressure chemical vapor deposition (LPCVD). The LPCVD process uses silane ($SiH_4$) as reactant, and the deposition rate is controlled by the concentration of silane. The deposition temperature is in the range of between 500 to 600° C. A series of processes of photolithography and etching are then performed to the oxide layer and the first conducting layer to define the tunneling oxide 30 and the floating gate 40. A data could be stored into this flash memory by driving electric charges to transverse the tunneling oxide 30 and inject into the floating gate 40.

Referring now to FIG. 3B, the key point of the present invention, to form a multilayer structure of dielectric films 50 (oxide/nitride/oxide) on the floating gate 40 and the substrate 10, is shown. According to the Step 1 in FIG. 2, the substrate is put into a chamber and then heated to the temperature of between 750 to 850° C. Referring then to the Step 2 in FIG. 2, a LPCVD process is performed to form an oxide layer 51. The reactants of the LPCVD process are generally $N_2O$ and $SiH_2Cl_2$. The flow rate of $N_2O$ is in the range of between 5 to 400 sccm, and the flow rate of $SiH_2Cl_2$ is between 5 to 200 sccm. The reaction pressure is between 0.1 to 1 torr. The deposition thickness is between 1 to 20 Å. After the deposition process, the gas supply for $N_2O$ and $SiH_2Cl_2$ is turned off.

Figure 2:
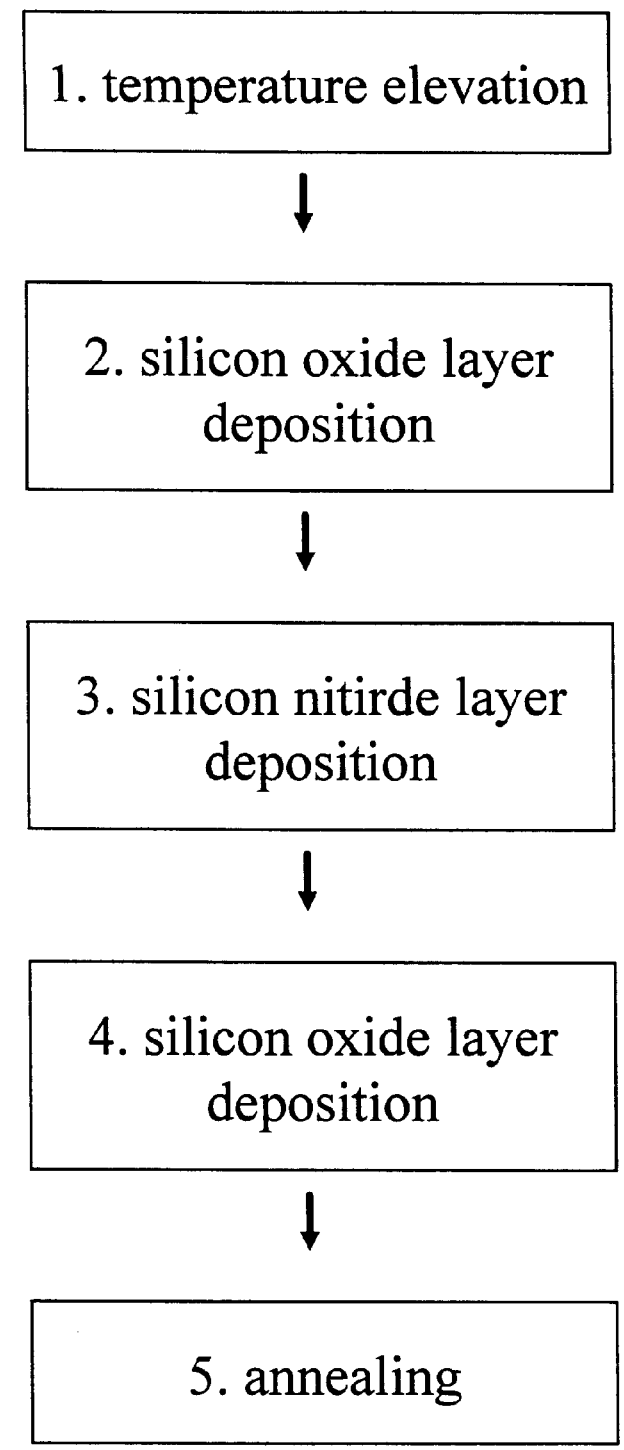
FIG. 2 is a process flow chart for multilayers of dielectric (oxide/nitride/oxide) according to the present invention.

Referring then to the Step 3 in FIG. 2, $N_2$ gas is used to purge the chamber. Thereafter, the chamber temperature is adjusted to the range of between 600 to 750° C., and then a LPCVD process is performed to form a nitride layer 52. The reactants of the LPCVD process are generally $NH_3$ and $SiH_2Cl_2$. The flow rate of $NH_3$ is in the range of between 5 to 200 sccm, and the flow rate of $SiH_2Cl_2$ is between 5 to 200 sccm. The reaction pressure is between 0.1 to 1 torr. The deposition thickness is between 1 to 10 Å. After the deposition process, the gas supply for $NH_3$ and $SiH_2Cl_2$ is turned off.

Refer now to the Step 4 in FIG. 2. The chamber temperature is adjusted to the range of between 750 to 850° C., and then a LPCVD process is performed to form an oxide layer 53. The reactants of the LPCVD process are the same with those at the Step 2. After depositing the oxide layer 51, the nitride layer 52, and the oxide layer 53 on the substrate 10, the Step 5 in FIG. 2 is then performed to lower the chamber temperature and to unload the wafer. The multilayer structure of dielectric films 50 shown in FIG. 3B could be defined by using the conventional method of photolithography and etching.

The multilayer structure of dielectric films 50 could also be oxide/nitride/oxide/nitride. The second nitride layer is formed on the second oxide layer 53. The process condition for forming the second nitride layer is the same with that for forming the first nitride layer 52.

Finally, a control gate 60 is formed on the multilayer structure of dielectric films 50, and the gate structure of a split flash memory is finished. The control gate 60 is made from polysilicon or amorphous silicon by using the conventional method of low-pressure chemical vapor deposition (LPCVD). The LPCVD process uses silane (SiH4) as reactant, and the deposition rate is controlled by the concentration of silane. The thickness of the control gate 60 is between 10 to 100 Å.

Please refer now to the Table below. The prior art takes much more time for forming the multilayer structure of dielectric films, because the heating and cooling processes should be performed for three times. In accordance with the present invention, only one heating and cooling process is needed to form the multilayer structure of dielectric films.

| Multilayers | Process Time | |
| --- | --- | --- |
| | Present Invention | Prior Art |
| ONO (3 layers) | 5 hr | 9 hr |
| ONON (4 layers) | 6 hr | 12 hr |

In accordance with the present invention, the process cost could be down and the throughput is much enhanced. In addition, it is not necessary to load and unload the substrate for each layer, during the processes of forming the multilayer structure of dielectric films. Therefore, metal and organic contamination would not occur during the process. Moreover, the wafer crack due to heating and cooling process would not also occur.

Furthermore, the present invention could be also applied at the process of forming a multilayer spacer. An ONO or ONON structure is also needed for a multilayer spacer.

While the invention has been particularly shown and described with reference to the preferred embodiments, it will be understood by those skilled in the art that various changes in form and detail may be made therein without departing from the spirit and scope of the present invention.

What we claimed is:

1. A method of fabricating an oxide/nitride multilayer structure for IC manufacture, comprising:
   (a) loading a substrate with an active region into a chamber and then heating said substrate;
   (b) forming an oxide layer on said substrate by using $N_2O$ gas and $SiH_2Cl_2$ gas as reactants in said chamber;
   (c) purging said chamber;
   (d) forming a nitride layer on said oxide layer in said chamber;
   (e) purging said chamber;
   (f) cooling said chamber and then unloading said substrate.

2. The method of claim 1, further repeating said steps (b) and (c) after said step (e) to form a three-layer structure as oxide/nitride/oxide (ONO).

3. The method of claim 1, further repeating said steps (b) to (e) after said step (e) to form a four-layer structure as oxide/nitride/oxide/nitride (ONON).

4. The method of claim 1, wherein said chamber is a LPCVD chamber.

5. The method of claim 1, wherein the flow rate of said $N_2O$ gas is between 20 to 400 sccm.

6. The method of claim 1, wherein the flow rate of said $SiH_2Cl_2$ gas is between 20 and 200 sccm.

7. The method of claim 1, wherein said oxide layer is formed at a temperature of between 750 to 850° C.

8. The method of claim 1, wherein said oxide layer is formed at a gas pressure of between 0.1 to 1 torr.

9. The method of claim 1, wherein said nitride layer is formed by using $NH_3$ gas and $SiH_2Cl_2$ gas as reactants.

10. The method of claim 9, wherein the flow rate of said $NH_3$ gas is between 10 to 200 sccm.

11. The method of claim 9, wherein the flow rate of said $SiH_2Cl_2$ gas is between 10 to 200 sccm.

12. The method of claim 1, wherein said nitride layer is formed at a temperature of between 600 to 750° C.

13. The method of claim 1, wherein said nitride layer is formed at a gas pressure of between 0.1 to 1 torr.

* * * * *